United States Patent
Booth et al.

(10) Patent No.: US 7,409,004 B2
(45) Date of Patent: Aug. 5, 2008

(54) HYBRID POLAR MODULATOR DIFFERENTIAL PHASE CARTESIAN FEEDBACK CORRECTION CIRCUIT FOR POWER AMPLIFIER LINEARIZATION

(75) Inventors: Richard W. D. Booth, Los Gatos, CA (US); Edwin R. Twitchell, San Jose, CA (US); Matthew A. Mow, Cupertino, CA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 1440 days.

(21) Appl. No.: 09/885,811

(22) Filed: Jun. 19, 2001

(65) Prior Publication Data

US 2002/0196864 A1  Dec. 26, 2002

(51) Int. Cl.
  *H04L 27/00* (2006.01)
(52) U.S. Cl. .................................... 375/295
(58) Field of Classification Search ............... 375/295, 375/296, 219, 261, 376, 297; 330/147, 149, 330/148, 127, 129, 82, 109, 76; 327/147, 327/156; 455/114.3; 342/152, 194; 708/442
See application file for complete search history.

(56) References Cited

U.S. PATENT DOCUMENTS

| | | | | |
|---|---|---|---|---|
| 4,135,200 A * | 1/1979 | Shanley, II | .................... | 358/21 |
| 5,646,627 A * | 7/1997 | Willis et al. | ................... | 342/189 |
| 5,675,287 A * | 10/1997 | Baker et al. | ................... | 330/129 |
| 5,894,496 A * | 4/1999 | Jones | ............................ | 455/126 |
| 5,905,760 A * | 5/1999 | Schnabl et al. | ............... | 375/296 |
| 5,930,689 A * | 7/1999 | Wilhite et al. | ................ | 455/126 |
| 5,933,767 A * | 8/1999 | Leizerovich et al. | ......... | 455/126 |
| 6,011,813 A * | 1/2000 | Ghosh | ......................... | 375/233 |
| 6,069,917 A * | 5/2000 | Werner et al. | ................ | 375/233 |
| 6,240,278 B1 * | 5/2001 | Midya et al. | .................. | 455/126 |
| 6,275,685 B1 * | 8/2001 | Wessel et al. | ................ | 455/126 |
| 6,304,140 B1 * | 10/2001 | Thron et al. | .................. | 330/149 |
| 6,353,359 B1 * | 3/2002 | Leizerovich | .................... | 330/2 |
| 6,396,344 B1 * | 5/2002 | Gentzler et al. | .............. | 330/149 |
| 6,493,409 B1 * | 12/2002 | Lin et al. | ...................... | 375/375 |
| 6,512,417 B2 * | 1/2003 | Booth et al. | ................. | 330/149 |
| 6,661,852 B1 * | 12/2003 | Genrich | ....................... | 375/326 |
| 6,690,743 B1 * | 2/2004 | Pellonpera | ................... | 375/296 |
| 6,697,436 B1 * | 2/2004 | Wright et al. | ................ | 375/296 |
| 6,735,419 B2 * | 5/2004 | Mitzlaff | .................... | 455/127.1 |
| 6,741,663 B1 * | 5/2004 | Tapio et al. | .................. | 375/297 |
| 6,975,686 B1 * | 12/2005 | Khatibzadeh et al. | ........ | 375/295 |
| 2001/0010713 A1 * | 8/2001 | Yamamoto | .................... | 375/297 |
| 2002/0016154 A1 * | 2/2002 | Huttunen | ....................... | 455/63 |
| 2002/0099598 A1 * | 7/2002 | Eicher et al. | ................... | 705/11 |
| 2002/0121892 A1 * | 9/2002 | Vandersteen | ................. | 324/118 |
| 2002/0191710 A1 * | 12/2002 | Jeckeln | .......................... | 375/296 |
| 2004/0046607 A1 * | 3/2004 | Grange | ........................... | 330/10 |

\* cited by examiner

*Primary Examiner*—Sam K Ahn
(74) *Attorney, Agent, or Firm*—McDermott Will & Emery LLP

(57) ABSTRACT

The present invention, generally speaking, provides a method of obtaining very accurate estimates of the phase and amplitude distortions introduced by radio frequency or microwave power amplifiers even where polar modulation is used.

6 Claims, 2 Drawing Sheets

Figure 1:
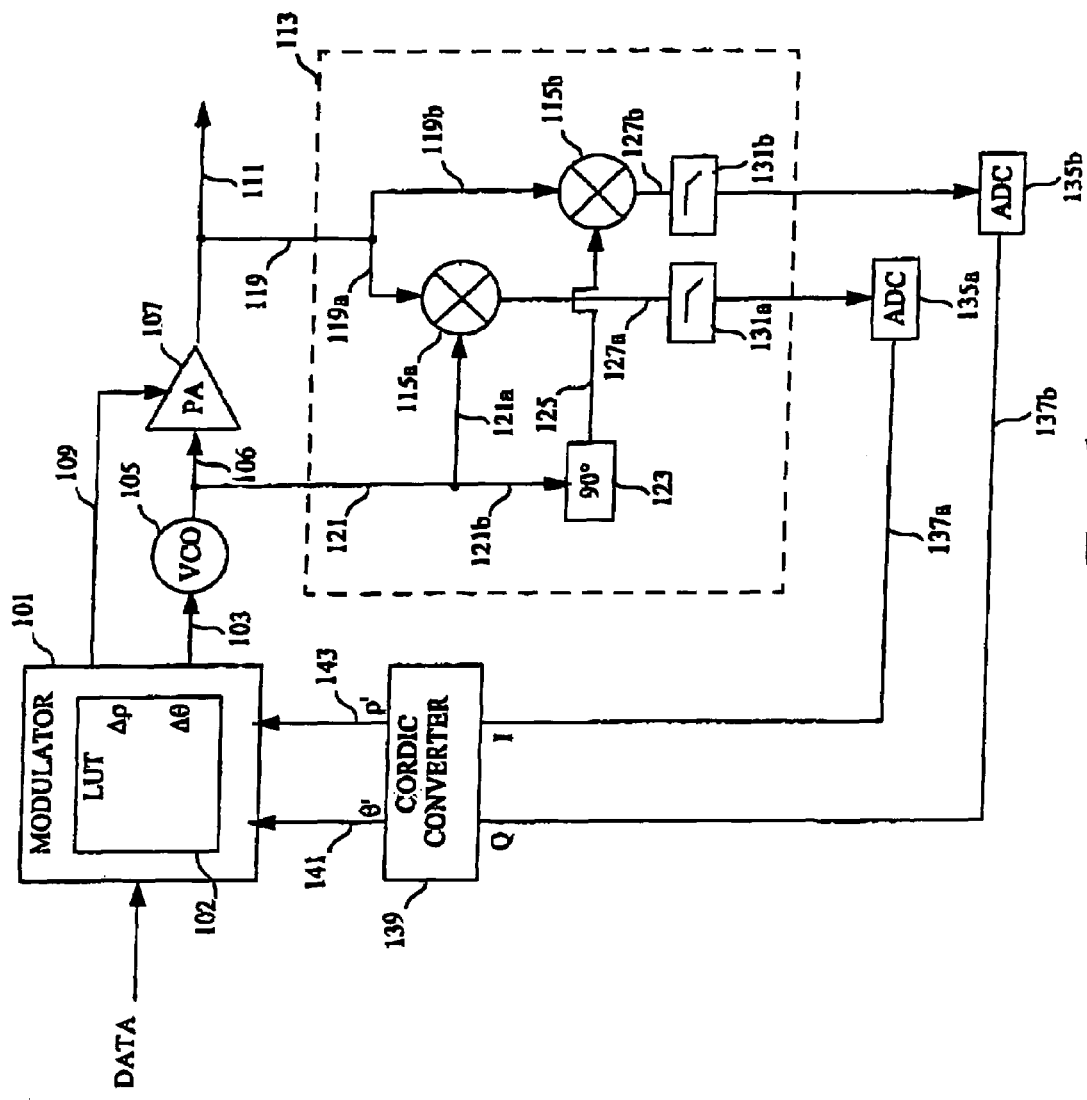

HYBRID POLAR MODULATOR DIFFERENTIAL PHASE CARTESIAN FEEDBACK CORRECTION CIRCUIT FOR POWER AMPLIFIER LINEARIZATION

BACKGROUND

1. Field of the Invention

The present invention relates to feedback correction for power amplifier linearization.

2. Description of Related Art

There are many methods for extending the upper limit of the power range of an amplifier. These are all intended to compensate for the more-or-less non-linear nature of the amplifier, particularly as the voltage waveform nears the upper and lower limits of the physically-achievable voltage range. Linearity compensation methods fall into two general categories: feed forward and feedback linearization. The methods discussed herein are of the feedback type.

There are two general types of feedback methods for linearization of RF or microwave power amplifiers, namely polar and Cartesian. The polar method of feedback correction compares both the output phase and amplitude to the input phase and amplitude of the amplifier and adjusts (predistorts) the input to account for the distortions introduced by the amplifier. The Cartesian method compares the output in-phase (I) and quadrature (Q) components with the input in-phase and quadrature components and predistorts the input to compensate for the errors introduced by the amplifier. In terms of accuracy, Cartesian feedback offers much higher precision and dynamic range. For instance, it is far easier to maintain linearity in mixers and baseband amplifiers (Cartesian feedback) than in an RF or microwave power detector used to estimate the amplitude of the envelope (polar feedback).

Polar modulation techniques applicable to radiotelephone communications are described, for example, in U.S. Pat. Nos. 6,377,784 and 6,864,668 of the present assignee, entitled HIGH-EFFICIENCY MODULATING RF AMPLIFIER and HIGH-EFFICIENCY AMPLIFIER OUTPUT LEVEL AND BURST CONTROL, respectively, filed Feb. 9, 1999 and incorporated herein by reference. In polar modulation, the phase of the output signal is controlled by modulating the phase of a constant envelope drive signal applied to the amplifier. The amplitude is varied by controlling the DC supply voltage to the power amplifier. Ideally, these DC supply voltage variations would transfer perfectly to the RF envelope, but in practice the conversion is impaired by non-linear effects, characterized as AM-to-AM (amplitude modulation) distortions and AM-to-PM (phase modulation) distortions. Both these types of errors degrade the power spectral density and the EVM (error vector magnitude) of the desired signal.

The accuracy of commonly-used power detectors is inadequate for the precision needed to prevent significant distortions to the spectrum and EVM. For this reason, some circuits have used a Cartesian feedback detector (or IQ demodulator as it is sometimes called).

Unfortunately, the reference for the in-phase and quadrature mixers of a Cartesian feedback detector is not readily available in a polar-modulation-based transmitter. In such a transmitter, the modulated signal does not exist until the final amplifier output. At this point the signal has already been impaired by distortions in the amplifier. One possible solution would be to generate another set of signals that includes both amplitude and phase modulation. However, new signals represent a potential for the creation of even more non-linear distortion. Furthermore, in frequency-hopping applications, it would be necessary to hop these references also, adding substantial complexity.

One possibility would be to simply use the I/Q baseband signal (before conversion to polar) as a reference. The approach would then would be to sample the high-power output signal, down-convert it to baseband and compare it to the baseband I/Q reference This approach, however, requires generation of a separate LO frequency which is necessary to downconvert the signal. Moreover, even if such a reference signal were created, it would still not allow for correction of impairments in the power amplifier.

SUMMARY OF THE INVENTION

The present invention, generally speaking, provides a method of obtaining very accurate estimates of the phase and amplitude distortions introduced by radio frequency or microwave power amplifiers even where polar modulation is used.

In accordance with one aspect of the invention, the problem of creating a reference for the feed back circuits is solved by, instead of a fixed reference, using the phase modulated input to the power amplifier as the reference to the Cartesian feedback circuit. Since the phase modulated input is constantly varying, the phase information at the output of the IQ demodulator will be the difference in phase between the input signal to the power amplifier and the output signal from the power amplifier. The resulting difference signal represents the phase shift through the amplifier itself, with the phase modulation removed. Changes over time and operating conditions in the expected phase shift through the amplifier can therefore be monitored and adaptively compensated for. Because the input signal to the power amplifier is constant-amplitude, the amplitude information obtained is the same as if an unmodulated signal had been used as the IQ demodulator reference.

In order to correct impairments in the power amplifier, the reference signal used is the signal being applied to the power amplifier (in one embodiment, the buffered and amplified output of an "on-frequency" VCO). Using the VCO output is advantageous because it will be impaired with VCO and buffer non-linearities and thus allow their effects to be subtracted out. (In the case of a baseband IQ reference, on the other hand, minor distortions in the VCO and buffers would not be discerned.)

BRIEF DESCRIPTION OF THE DRAWING FIGURES

Figure 2:
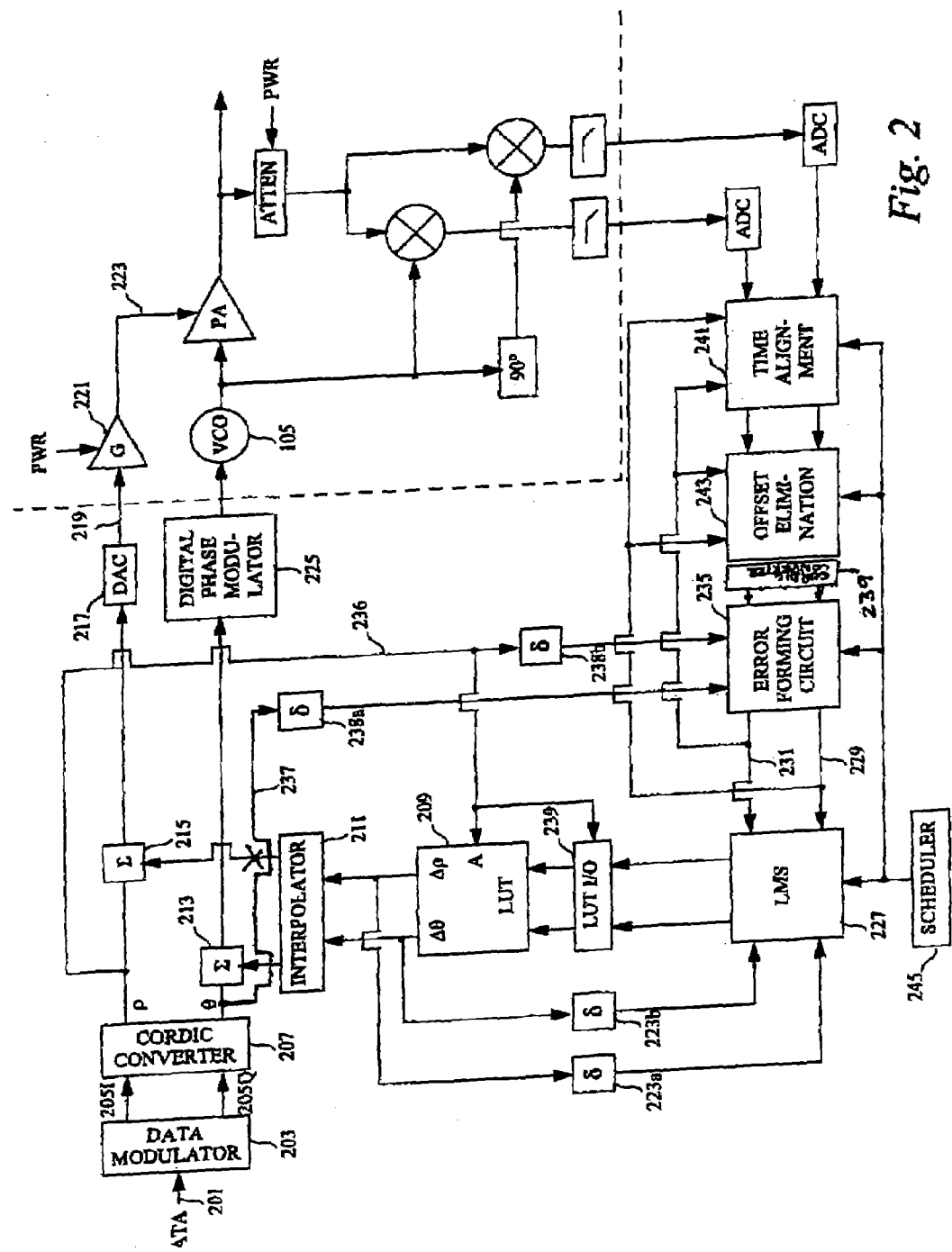

The present invention may be further understood from the following description in conjunction with the appended drawing figures. In the figures:

FIG. 1 is a simplified block diagram of one embodiment of a linearization feedback circuit; and FIG. 2 is a more detailed block diagram of another embodiment of a linearization feedback circuit.

DETAILED DESCRIPTION OF THE PREFERRED EMBODIMENTS

Referring now to FIG. 1, a diagram is shown of a linearization feedback circuit in accordance with an exemplary embodiment of the invention. A modulator 101 receives data and in response produces phase and amplitude control signals used to generate an RF signal representing the data. In the illustrated embodiment, the modulator 101 includes a correction table 102 used to store delta-phase and delta-amplitude values for various amplitude levels. These values are used to adjust the phase and amplitude control signals to compensate for distortion of the amplifier.

The phase control signal 103 is input to a voltage controlled oscillator (VCO) 105 that produces a low-level RF output signal of the desired phase. The output signal of the VCO forms an input signal 106 for input to the amplifier and is applied to an amplifier chain including one or more amplifier stages. The amplifier chain is represented in FIG. 1 by an amplifier 107.

The amplitude control signal 109 produced by the modulator is applied to the amplifier chain, which in response produces an amplified RF output signal 111. The RF output signal is coupled to an antenna (not shown) for transmission.

An IQ demodulator 113 is provided including an I mixer 115a and a Q mixer 115b. A measurement signal 119 obtained from the RF output signal 111 is split into two signals 119a and 119b, which are then input to the I and Q mixers 115a and 115b. A reference signal 121 obtained from input signal 106 is split into two signals, one of which is phase-shifted 90 degrees by a phase shifter 123, resulting in reference signals 121a and 125. These signals are input to what would ordinarily be the local oscillator ports of the mixers 115a and 115a.

The mixers 115a and 115b produce respective output signals 127a and 127b, which are low-pass filtered using filters 131a and 131b and subsequently converted to digital signals using A/D converters 135a and 135b. The resulting digital I and Q signals 137a and 137b are applied to a chordic converter 139, which produces corresponding polar signals, i.e., a phase signal 141 and an amplitude signal 143. These signals are input to the modulator 101, where they are used in accordance with an efficient update scheme described more fully hereinafter.

The manner of operation of the circuit of FIG. 1 may be more readily understood by considering mathematical representations of selected signals in FIG. 1. The input and output signals, respectively, of the amplifier 107 may be represented as follows:

$$\cos[\omega t + \phi(t)]$$

$$\rho(t)\cos\{\omega t + \phi(t) + \theta + PM[\rho(t)]\}$$

In the foregoing equations, $\phi(t)$ represents the desired phase modulation, and $\rho(t)$ represents the desired amplitude modulation. Furthermore, $\theta$ represents a "static," frequency-dependent phase shift introduced by the amplifier 107, and $PM[\rho(t)]$ represents a "dynamic" phase shift resulting from AM-PM distortion of the amplifier 107.

Recognizing that multiplication is mutative, there is no difference whether quadrature shifting is performed on either input of mixers 115a, b. Since FIG. 1 shows the signal 125 is phase-shifted by 90 degrees relative to the input signal 106, the signal 125 may be represented as:

$$\sin[\omega t + \phi(t)]$$

The I mixer 115a performs the following multiplication:

$$\cos[\omega t + \phi(t)]\rho(t)\cos\{\omega t + \phi(t) + \theta + PM[\rho(t)]\}$$

As is well known, the foregoing multiplication produces both sum and difference components. Following low-pass filtering, only the following difference component remains:

$$\frac{\rho(t)}{2}\cos\{PM[\rho(t)] + \theta\}$$

Similarly, when the output signal 127b of the Q mixer 115b is low-pass filtered, the resulting signal is:

$$\frac{\rho(t)}{2}\sin\{PM[\rho(t)] + \theta\}$$

When the foregoing I and Q signals are converted to signals $\rho'$ and $\theta'$, ideally, the following equalities are satisfied:

$$\rho' = \rho(t)$$

$$\theta' = \phi(t)$$

$$= \theta + PM[\rho(t)]$$

$$= \theta + \Delta\theta$$

That is, the amplitude of the RF output signal 111 is the same as the desired amplitude. Also, the phase of the RF output signal 111 is the same as the desired phase, set in accordance with the static phase shift, $\theta$, of the amplifier at the operating frequency and the expected distortion, $PM[\rho(t)]$, of the amplifier as a function of amplitude variations. Note that, in order for the phase equality to be satisfied, the phase correction factor $\Delta\theta$ applied within the modulator must equal the actual dynamic phase modulation $PM[\rho(t)]$ occurring within the amplifier.

The foregoing description omits various details that will be apparent to one of ordinary skill in the art. For example, directional couplers (not shown) are used to obtain the measurement signal 111 and the reference signal 121. In addition, signal splitters (not shown) are used to split the signals 119 and 121 into signals 119a and 119b and 121a and 121b. Moreover, signal levels at various points within the circuit may be set appropriately using attenuators, amplifiers, or a combination of the same. For example, amplifiers will typically be used in the paths of the signals 121, 127a and 127b. In addition, a combination of attenuators (fixed and/or variable) and an amplifier will typically be used in the path of the signal 119.

As may be appreciated from the foregoing description, in operation of the circuit of FIG. 1, a sample of the modulated input signal is tapped off ahead of the amplifier (using a directional coupler, for example). This signal (i.e., signal 121) is strictly phase modulated and there is no amplitude variation on this part of the signal. This signal may be amplified and used to drive the LO (local oscillator) ports of the IQ demodulator 113. A sample of the output signal is also tapped off (e.g., using a second directional coupler). This signal (i.e., signal 119) is split and used to drive the RF ports of the two mixers 115a and 115b. IF (intermediate frequency) low-pass filtered outputs of the mixers may be amplified and connected to analog to digital converters 135a and 135b. The information in the two resulting signals 137a and 137b is converted to polar form using the cordic converter 139, and can be used to calculate: 1) the phase difference between the input and the output of the amplifier (signals 106 and 111, respectively); and 2) the amplitude of the output signal 111.

Referring to FIG. 2, a block diagram is shown including relevant portions of the modulator 101. In an exemplary embodiment, the modulator receives data signals 201, which are applied to a conventional IQ modulator 203 to produce IQ signals 205I and 205Q. These signals are converted to polar form (ρ and θ) using a cordic converter 207.

The amplitude signal ρ is used to index a look-up-table (LUT) 209 storing correction factors Δρ, Δθ. In the illustrated embodiment, the size of the LUT 209 is kept small by using interpolation. That is, an interpolator 211 is used to form interpolated Δρ, Δθ from those output from the LUT 209. These interpolated values are added to the ρ and θ values produced by the cordic converter 207 using summation elements 213 and 215. An output signal from the summation element 213 is applied to a digital to analog converter 217 to produce an analog amplitude signal 219. This signal is amplified in a variable-gain amplifier 221 in response to a power control signal to form a final amplitude signal 223 which is applied to the amplifier. An output signal from the summation element 215 is applied, in an exemplary embodiment, to a digital phase modulator 225. Of course, the digital phase modulator and the VCO 105 could be replaced in other embodiments with a conventional analog modulator (preceded by a digital to analog converter).

In an exemplary embodiment, an LMS algorithm is used to adapt the values stored within the LUT 209 in order to track variations within the amplifier. The LMS algorithm may be executed in software, but is preferably implemented in a hardware LMS unit 227. Of course, the adaptation algorithm employed need not be specifically an LMS algorithm—other algorithms might be used.

Adaptation is performed by calculating new Δρ, Δθ values for a given amplitude, using the old Δρ, Δθ values and amplitude and phase error signals 229 and 231. The old Δρ, Δθ values are delayed using delay elements 233a and 233b to allow for the delay from read-out of these values to signal generation and measurement.

As previously described, the Cartesian feedback circuit produces amplitude and phase difference information. Accordingly, an error forming circuit 235 receives as inputs the amplitude signal 236 from the cordic converter 207 and the interpolated Δθ signal 237 from the LUT 209. Once again, these signals are delayed using delay elements 238a and 238b. The amplitude signal 237 is also applied to a LUT I/O circuit 239 used to control updating of the LUT 209.

The time delay through the signal generation and measurement path may vary somewhat according to operating conditions. Furthermore, the Cartesian feedback circuit produces offset errors, both amplitude and phase. To enable accurate updating of the LUT 209, time alignment and offset correction must be performed prior to activation of the LMS unit 227. A time alignment circuit 241 and an offset correction circuit 243 are used for this purpose. These circuit receive error signals 229, 231 from the error forming circuit 235 and are controlled by a scheduler 245. At startup, the scheduler controls the time alignment circuit 241 and the offset correction circuit 243 so as to achieve time alignment and offset correction. When time alignment and offset correction have been achieved, the scheduler activates the LMS unit 227, which begins updating the LUT 209. In an exemplary embodiment, the LUT 209 is updated, once per symbol time.

Thus, there has been described a Cartesian feedback circuit operable in conjunction with a polar modulator to achieve efficient, accurate linearity correction. The Cartesian feedback circuit avoids the need for a local oscillator or other reference-forming circuit, minimizing complexity and minimizing errors that would otherwise be introduced into the circuit.

It will be apparent to those of ordinary skill in the art that the present invention can be embodied in other specific forms without departing from the spirit or essential character thereof. The described embodiments are therefore intended to be in all respects illustrative and not restrictive. The scope of the invention is indicated by the appended claims, rather than the foregoing description, and all changes which come within the meaning and range of equivalents thereof are intended to be embraced therein.

What is claimed is:

1. A method of generating feedback information in IQ (In-phase and Quadrature) form for linearity compensation of a communications transmitter using polar modulation and having a communications signal amplifier, comprising:

using a polar modulator to produce a phase-modulated signal and an amplitude signal;

using the phase-modulated signal, producing an input measurement signal exhibiting varying phase and a substantially constant envelope;

amplifying the phase-modulated signal to produce an output signal; and using an IQ demodulator to produce the feedback information for the linearity compensation, the IQ demodulator receiving as input signals the input measurement signal and the output signal, and producing as output signals in-phase and quadrature components representing a phase difference between the input measurement signal and the output signal.

2. A communications signal transmitter for transmitting a data signal by using polar modulation, comprising:

a data modulator responsive to the data signal for producing an amplitude signal and a phase-modulated signal;

an amplifier responsive to the amplitude signal and the phase-modulated signal for producing a desired communications signal; and feedback circuitry for receiving the phase-modulated signal and the communications signal, and producing, as feedback information in IQ (In-phase and Quadrature) form for linearity compensation of the communications signal transmitter, in-phase and quadrature components representing a phase difference between the phase-modulated signal and the communications signal.

3. The apparatus of claim 2, wherein the feedback circuitry comprises:

first and second mixers;

a first pair of signals derived from the communications signal, a different one of the first pair of signals being applied to each of the mixers; and a second pair of signals derived from the phase-modulated signal, a different one of the second pair of signals being applied to each of the mixers;

wherein the signals of at least one the first pair of signals and the second pair of signals are in quadrature relation to one another.

4. The apparatus of claim 2, wherein the data modulator further comprises:

a correction table for correcting the amplitude signal and the phase-modulated signal and adaptation means responsive to the feedback information for adapting values of the correction table.

5. The apparatus of claim 4, wherein the adaptation means is based on a statistical algorithm.

6. The apparatus of claim 5, wherein the statistical algorithm is a least mean square algorithm.

* * * * *